United States Patent [19]
Lee

[11] Patent Number: 6,083,320
[45] Date of Patent: Jul. 4, 2000

[54] ROBOT FOR AND METHOD OF TRANSPORTING SEMICONDUCTOR WAFERS

[75] Inventor: Seung-kun Lee, Suwon, Rep. of Korea

[73] Assignee: Samsung Electronics Co., Ltd., Suwon, Rep. of Korea

[21] Appl. No.: 09/019,187

[22] Filed: Feb. 5, 1998

[30] Foreign Application Priority Data

Feb. 28, 1997 [KR] Rep. of Korea .................. 97-6794

[51] Int. Cl.[7] ...................................... B05C 11/00
[52] U.S. Cl. ........................ 118/58; 118/315; 118/423
[58] Field of Search ..................... 134/902; 414/940; 901/43; 118/58, 423, 315

[56] References Cited

U.S. PATENT DOCUMENTS

| | | | |
|---|---|---|---|
| 4,286,541 | 9/1981 | Blackwood | 118/58 |
| 4,708,629 | 11/1987 | Kasamatsu | 118/315 |
| 5,769,947 | 6/1998 | Krappweis | 118/411 |

*Primary Examiner*—Brenda Adele Lamb
*Attorney, Agent, or Firm*—Jones Volentine, LLP

[57] ABSTRACT

A robot for transporting a plurality of wafers from one processing station to another in a batch-type semiconductor device manufacturing process includes a chuck for holding wafers, a spray nozzle for spraying inert gas on the wafers in order to cover them and thereby prevent their contact with the surrounding air, and a supply line for connecting the spray nozzle and an inert gas supply source. The spray nozzle has a plurality of spray openings spaced apart at uniform intervals. The inert gas is sprayed over the wafers from a nozzle that moves with the robot, thereby creating an inert gas environment around the wafers. Accordingly, as the robot moves, water or other particles adhering to the wafers do not contact the surrounding air moving relative thereto. Hence, marks are prevented from being produced on the wafers.

10 Claims, 5 Drawing Sheets

US 6,083,320

ROBOT FOR AND METHOD OF TRANSPORTING SEMICONDUCTOR WAFERS

BACKGROUND OF THE INVENTION

1. Field of the Invention

The present invention relates to a robot for transporting semiconductor wafers, and more particularly, to a robot for transporting a plurality of processed wafers to a downstream processing station in a batch-type semiconductor fabrication facility. The present invention also relates to a method of transporting the wafers from one processing station to another.

2. Description of the Related Art

Generally, semiconductor devices are produced in a processing facility by repeatedly performing a plurality of various processes thereon. The processing facility includes transportation apparatus to transport the wafers from one processing station to another. The transportation apparatus are classified according to how they transport wafers, that is, a single-type for transporting wafers one-by-one, or a batch-type for transporting a plurality of wafers at a time.

Robots are widely used for transporting wafers between processes because they are easily controlled automatically. For example, wafer cleaning is performed by sequentially placing a plurality of wafers in a bath for etching and a bath for rinsing, repeatedly performing these steps, and then drying them. A robot is used for transporting the wafers from the etching bath to the rinsing bath and to the dryer.

FIG. 1 shows one example of a conventional robot 1 which comprises a vertical bar 2 and a horizontal bar 3. The horizontal bar 3 has a chuck 4 for holding a plurality of wafers W. The vertical bar 2 is driven by a driving part 5 which moves in both a vertical direction, causing the chuck 4 to move up and down, and back and forth longitudinally along a processing line 6 to thereby transport a plurality of wafers received in the chuck 4 to the next bath or subsequent processing station.

However, when the wafers are transported from one processing station to another by the conventional robot, they are exposed to the surrounding air. Water adhered to the wafer surface as the result of etching and rinsing processes contacts the air. As a result, marks are formed on the wafer surface which in turn result in processing defects causing a reduction in wafer quality. Therefore, in order to keep the generation of the marks to a minimum, the robot should move over as small a distance as possible.

However, especially when wafers are transported from rinsing processing equipment to a dryer, they are exposed to the air for a greater amount of time which generates marks that are substantial enough to cause severe processing defects. It is thus important to pay special attention to the transportation of the wafers during this processing step.

However, it is difficult to properly manage these processing defects caused by environmental factors. In fact, the contact of the transported wet wafers with the air creates processing defects so often that it becomes one of the main causes of low production yields.

SUMMARY OF THE INVENTION

An object of the present invention is to provide a robot for transporting semiconductor wafers which substantially overcomes one or more of the problems, limitations and disadvantages of the related art.

More specifically, an object of the present invention is to provide a robot for preventing the generation of marks otherwise caused by water on the wafer surface contacting the surrounding air as they are transported from one processing station to another.

To achieve this and other objects and advantages in accordance with the present invention, the robot for transporting semiconductor wafers comprises a chuck for holding at least one wafer, an inert gas spray nozzle for spraying inert gas in order to surround the wafers with an inert gas environment to prevent their contact with the surrounding air, and an inert gas supply line for connecting the inert gas spray nozzle and an inert gas supply source.

In another aspect, the present invention provides a method for transporting wafers which includes the steps of loading a plurality of wafers in a chuck attached to the arm of a robot, immersing the wafers in a bath (rinsing or etching), moving the wafers from the bath to a downstream processing station, and while the wafers are being moved, spraying an inert gas over the wafers to create an inert gas environment around the wafers.

It is to be understood that both the foregoing general description and the following detailed description are exemplary and explanatory and are intended to provide further explanation of the invention as claimed.

BRIEF DESCRIPTION OF THE DRAWINGS

These and other advantages will be described with reference to the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
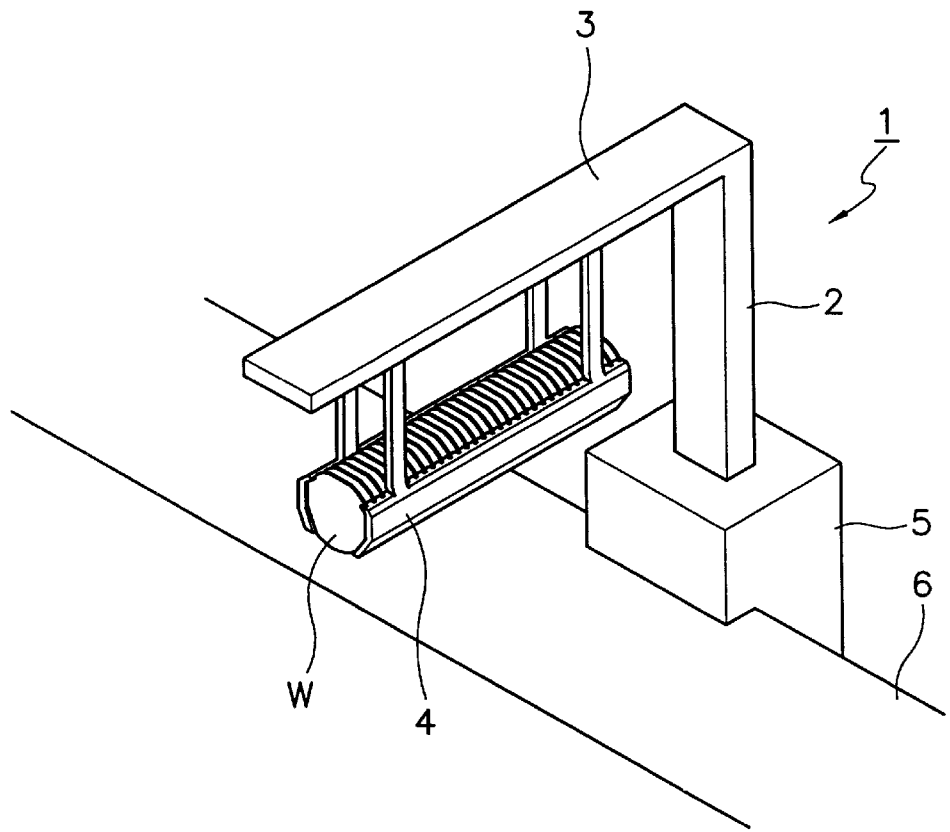
FIG. 1 is a perspective view of a conventional robot for transporting semiconductor wafers.
Figure 2:
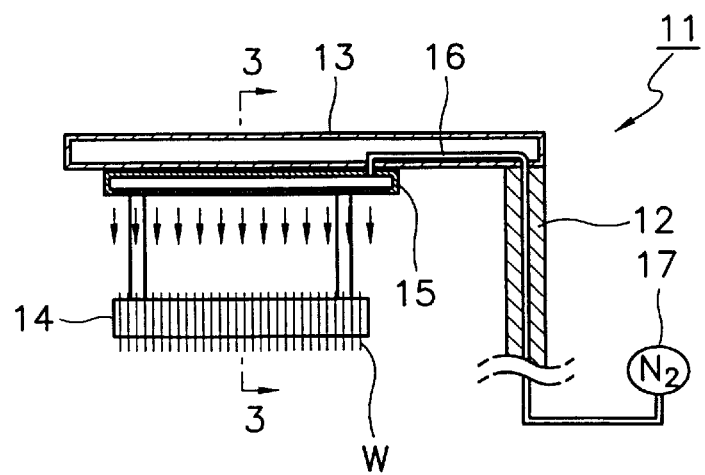
FIG. 2 is a cross-sectional view of a robot for transporting semiconductor wafers according to the present invention.
Figure 3:
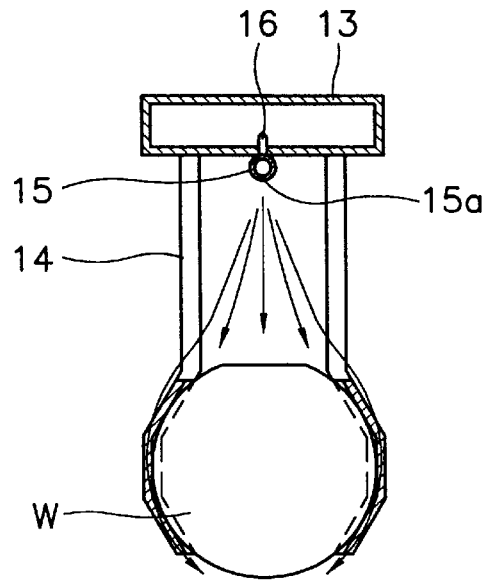
FIG. 3 is a sectional view of the robot taken along line 3—3 in FIG. 2.
Figure 8A:
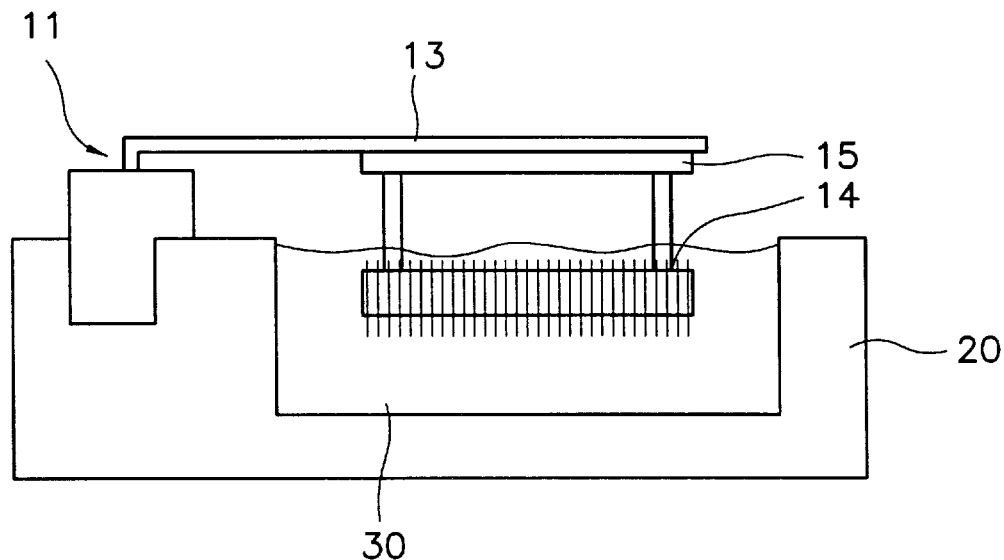
FIGS. 8A, 8B, and 8C are schematic diagrams of the robot for transporting wafers, illustrating the method by which the wafers are transported in a processing facility according to the present invention.
Figure 8B:
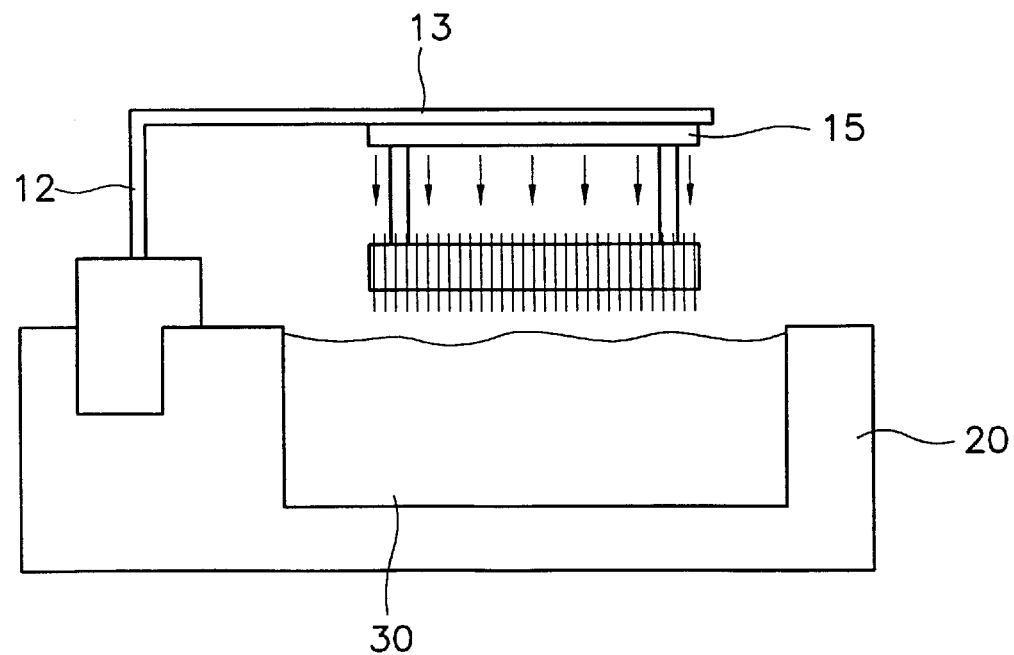
Figure 8C:
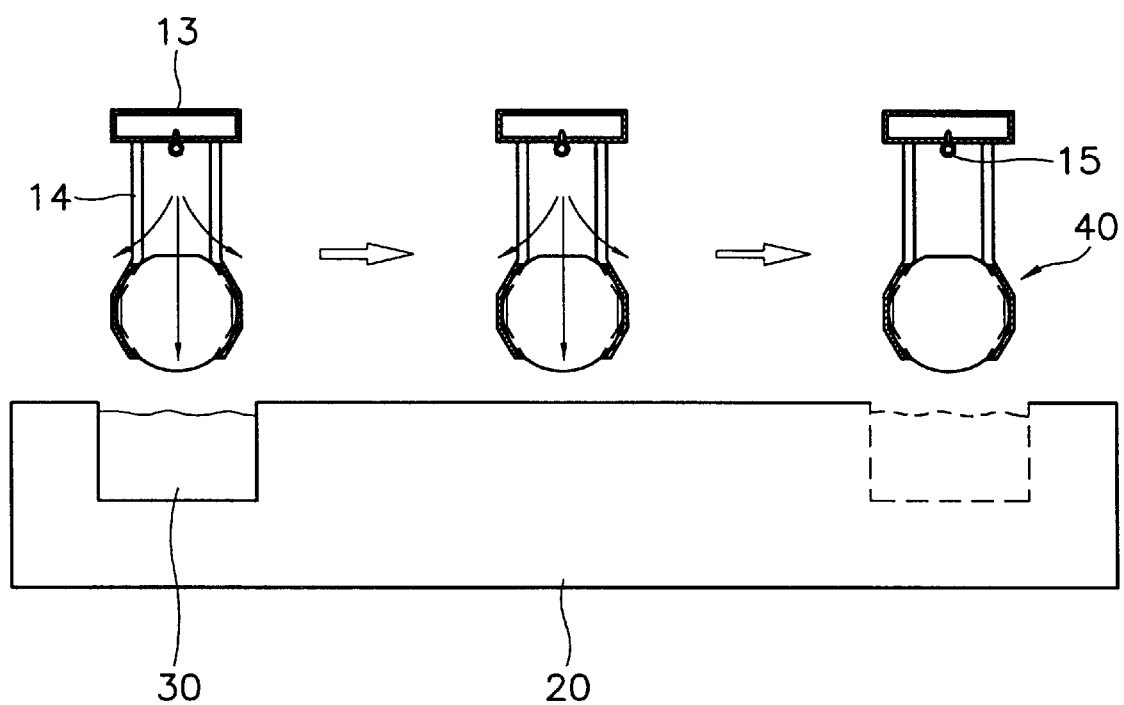

FIG. 2 and FIG. 3 show a robot for transporting wafers according to the present invention, wherein a plurality of wafers are transported at the same time in a batch-type manufacturing facility 20 (FIGS. 8A–8C). The robot 11 comprises a vertical part 12 which moves up and down, a horizontal part 13 which moves back and forth, and a chuck 14 which is carried by the horizontal part 13 and is loaded with more than one wafer W.

In addition, a spray nozzle 15 for spraying an inert gas on a plurality of wafers held by the chuck 14 is preferably disposed on the bottom portion of the horizontal part 13 which is located over the wafers. The spray nozzle 15 is connected with an inert gas supply source 17 through a supply line 16. In this embodiment, the inert gas is nitrogen ($N_2$), although other inert gases are contemplated for use in the present invention. The inert gas supplied from the inert gas supply source 17 through the supply line 16 is sprayed through the spray nozzle 15 over the entirety of the wafers W held by the chuck 14. This creates an inert gas environment surrounding the wafers to thereby prevent the wafers from contacting the surrounding air.

The spray nozzle 15 has a plurality of spray openings 15a longitudinally spaced apart at uniform intervals sufficient to allow the inert gas to be sprayed over the entirety of the wafers W held by the chuck 14. The diameter of the output is the same as or greater than that of the input of the spray openings 15a so that the inert gas is sprayed over a wide angle.

Figure 4:
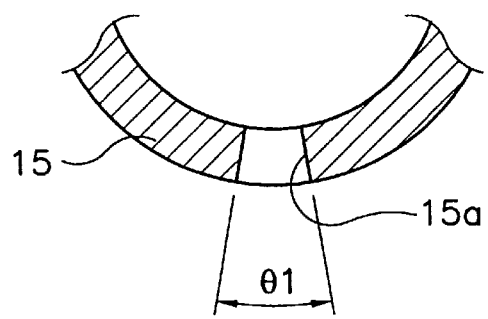
FIG. 4 and FIG. 5 are enlarged cross-sectional views of the spray openings of inert gas spray nozzles of robots for transporting semiconductor wafers according to the present invention.
Figure 5:
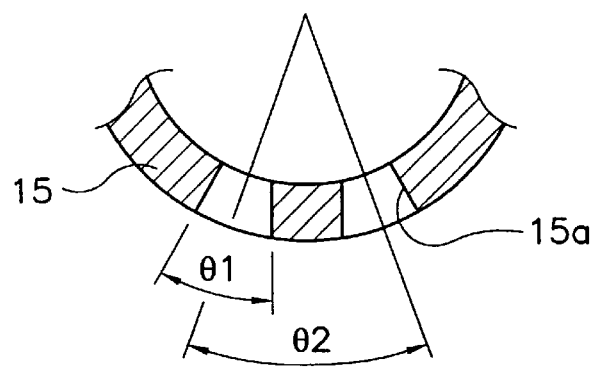
Figure 6:
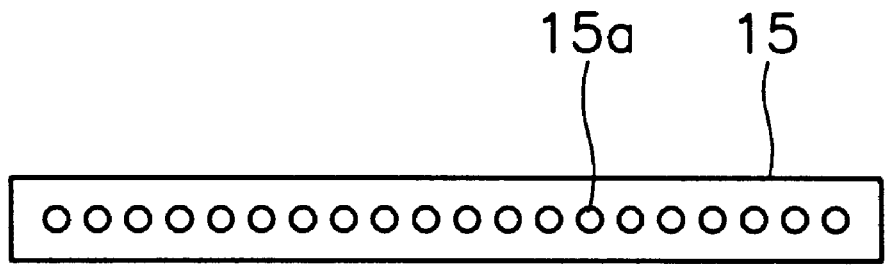
FIG. 6 and FIG. 7 are bottom views of the spray openings of inert gas spray nozzles of the robots for transporting semiconductor wafers according to the present invention.
Figure 7:
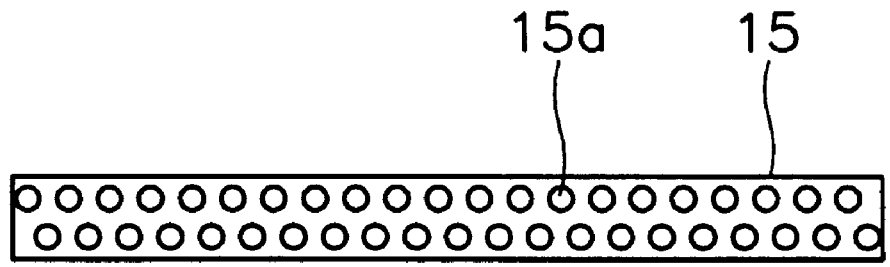

One example of the spray openings 15a is shown in FIG. 4 and FIG. 6. In this embodiment, a plurality of the openings 15a are aligned in one direction. In the embodiment shown in FIG. 5 and FIG. 7, the openings are provided in two lines offset from one another. Other arrangements of the openings are, of course, also possible.

The taper (angles $\theta_1$, $\theta_2$) of the spray opening 15a is determined and designed in accordance with the distance between the spray nozzle 15 and the wafers. That is, the longer the distance between the nozzle and the wafers, the smaller the taper angle. Conversely, the shorter the distance between the nozzle and the wafers, the larger the taper angle. In addition, the spray nozzle 15 is made of a non-corrosive material, such as TEFLON, so that it will not be affected by the processing chemicals used during the etching processes.

The spray nozzle 15 along with the inert gas supply line 16 is secured to the vertical part 12 and the horizontal part 13 and thus moves with the robot 11 while the inert gas is continuously supplied thereto (FIG. 8C). In addition, the spray nozzle 15 is made of a flexible TEFLON tube so that it will not be permanently deformed by the repeated movement of the robot 11.

The structure of the robot 11 according to the present invention as described above makes it possible to significantly reduce the marks generated by the contact of the water adhered to the wafers with the air while a plurality of such wet wafers are transferred after being etched or rinsed.

More specifically, as shown in FIG. 2 and FIG. 3, inert gas is sprayed through the spray opening 15a of the spray nozzle 15 so that it surrounds the surfaces of the plurality of wafers W held by the chuck 14. The inert gas forms a barrier between the wafers and the surrounding air and prevents the contact of the water on the wafers with the surrounding air to reduce the possibility of the formation of marks on the wafers. In addition, when the wafers are treated with chemicals, the inert gas prevents particles, which are generated by the chemical reaction and adhere to the wafers, from contacting the surrounding air.

The inert gas is only sprayed during the transportation of the wafers, and is shut off while the wafers are being processed. Specifically, as shown in FIGS. 8A–8C, the wafers are immersed in a bath 30 (of water for rinsing or of chemicals for etching). Then the wafers are withdrawn from the bath 30 and are transported by the robot 11 to a second processing station 40 (either a drying station after being rinsed or the rinsing station after being chemically etched, for example). The inert gas is sprayed during the transportation of the wafers as shown by the arrows in FIG. 8C.

The inert gas surrounds the wafers to inhibit the generation of marks which would otherwise occur by the contact of the water or chemicals on the transported wafers with the surrounding air. Thus, processing defects are reduced and a high production yield can be maintained.

Although the present invention has been described in detail, it should by understood that various changes, substitutions and alterations can be made hereto without departing from the spirit and scope of the invention as defined by the appended claims.

What is claimed is:

1. A robot for transporting semiconductor wafers, said robot comprising:

an arm;

a chuck supported by said arm and sized to hold at least one wafer;

a driving part, to which said arm is mounted, and operable to move said arm and the wafer chuck supported by said arm from one location to at least one other location;

a spray nozzle supported by said arm so as to be movable therewith as said arm is moved from said one location to the other, said nozzle having spray openings configured to produce an inert gas environment that surrounds each of the wafers held by said chuck to thereby prevent their contact with the surrounding air as said robot arm is moved by said driving part;

an inert gas supply source; and a supply line connecting said spray nozzle and said inert gas supply source.

2. The robot as claimed in claim 1, wherein said spray openings are spaced apart at uniform intervals.

3. The robot as claimed in claim 2, wherein each of said spray openings has an inner end and an outer end, the outer end being downstream from said inner end with respect to the direction in which the inert gas is sprayed by the nozzle, the outer end having a larger output diameter than the diameter of said inner end so that the inert gas sprayed through each of said spray openings disperses over an angle.

4. The robot as claimed in claim 3, wherein each of said spray openings tapers from the outer to the inner end thereof.

5. The robot as claimed in claim 2, wherein said spray openings are aligned in at least two spaced apart rows extending longitudinally of said spray nozzle.

6. The robot as claimed in claim 1, wherein said spray nozzle is made of a chemical resistant material.

7. The robot as claimed in claim 1, wherein said supply line is made of a flexible material.

8. The robot as claimed in claim 1, wherein said inert gas is nitrogen ($N_2$).

9. The robot as claimed in claim 1, wherein said driving part is a linear drive operable to move said arm linearly in at least one direction.

10. The robot as claimed in claim 9, wherein said arm comprises a vertical part extending vertically from said driving part, and a horizontal part extending horizontally from said vertical part, said chuck and said spray nozzle are disposed at an undersurface of the horizontal part of said arm, and said driving part is operable to move said arm linearly both vertically and horizontally.

* * * * *